(12) United States Patent
Nakamura

(10) Patent No.: US 9,998,096 B2
(45) Date of Patent: Jun. 12, 2018

(54) WAVE SEPARATOR

(71) Applicant: Murata Manufacturing Co., Ltd., Nagaokakyo-shi, Kyoto-fu (JP)

(72) Inventor: Soichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 64 days.

(21) Appl. No.: 15/172,270

(22) Filed: Jun. 3, 2016

(65) Prior Publication Data

US 2017/0005637 A1 Jan. 5, 2017

(30) Foreign Application Priority Data

Jun. 30, 2015 (JP) ................................. 2015-132236

(51) Int. Cl.
| | |
|---|---|
| *H03H 9/70* | (2006.01) |
| *H03H 9/72* | (2006.01) |
| *H03H 7/38* | (2006.01) |
| *H03H 7/46* | (2006.01) |
| *H04B 1/00* | (2006.01) |
| *H03H 9/00* | (2006.01) |
| *H03H 9/05* | (2006.01) |
| *H03H 9/10* | (2006.01) |
| *H03H 9/145* | (2006.01) |

(52) U.S. Cl.
CPC ............... *H03H 9/70* (2013.01); *H03H 7/46* (2013.01); *H03H 9/0009* (2013.01); *H03H 9/0576* (2013.01); *H03H 9/1085* (2013.01); *H03H 9/725* (2013.01); *H04B 1/0057* (2013.01); *H03H 9/14541* (2013.01)

(58) Field of Classification Search
CPC ............ H03H 7/00; H03H 7/46; H03H 7/461; H03H 7/466; H03H 7/468; H03H 9/0009; H03H 9/0571; H03H 9/0576; H03H 9/1085; H03H 9/14541; H03H 9/706; H03H 9/725; H03H 9/70; H04J 1/02; H04B 1/0053; H04B 1/0057; H04B 1/38; H04B 1/40; H04B 1/50
USPC ..................... 333/126, 129, 132, 133; 455/82
See application file for complete search history.

(56) References Cited

U.S. PATENT DOCUMENTS

| | | | | |
|---|---|---|---|---|
| 4,091,344 A | * | 5/1978 | LaTourrette | .......... H01P 1/2136 333/134 |
| 6,380,823 B1 | | 4/2002 | Ikata et al. | |
| | | (Continued) | | |

FOREIGN PATENT DOCUMENTS

| | | | |
|---|---|---|---|
| JP | 2000-349586 A | | 12/2000 |
| JP | 2005-123910 | * | 5/2005 |
| JP | 2010-045563 A | | 2/2010 |

*Primary Examiner* — Barbara Summons
(74) *Attorney, Agent, or Firm* — Keating & Bennett, LLP

(57) ABSTRACT

A wave separator includes an n number (n being a natural number of 3 or larger) of band pass filters having an n number or larger of mutually different pass bands, and a common terminal. For a first of the band pass filters that is one of a band pass filter having a center frequency of a pass band at a lowest side and a band pass filter having a center frequency of a pass band at a highest side and that has a larger or equal difference in a center frequency of a pass band from an adjacent band pass filter as compared with the other band pass filter satisfies a predetermined configuration for a second band pass filter having a pass band adjacent to the first band pass filter.

20 Claims, 21 Drawing Sheets

(56) References Cited

U.S. PATENT DOCUMENTS

| | | | |
|---|---|---|---|
| 6,870,441 B2 * | 3/2005 | Veyres | H03H 7/0115 333/127 |
| 7,138,746 B2 * | 11/2006 | Taniguchi | H03H 9/0576 310/313 R |
| 7,164,306 B2 * | 1/2007 | Makino | H03H 7/463 327/407 |
| 2009/0147805 A1 * | 6/2009 | Wada | H01P 1/2135 370/497 |
| 2014/0266510 A1 * | 9/2014 | Silver | H03H 9/465 333/186 |
| 2014/0282311 A1 * | 9/2014 | Turner | H03H 9/465 716/104 |

* cited by examiner

FIG. 4
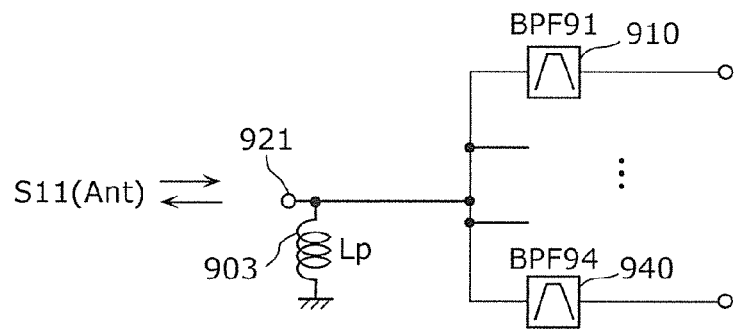
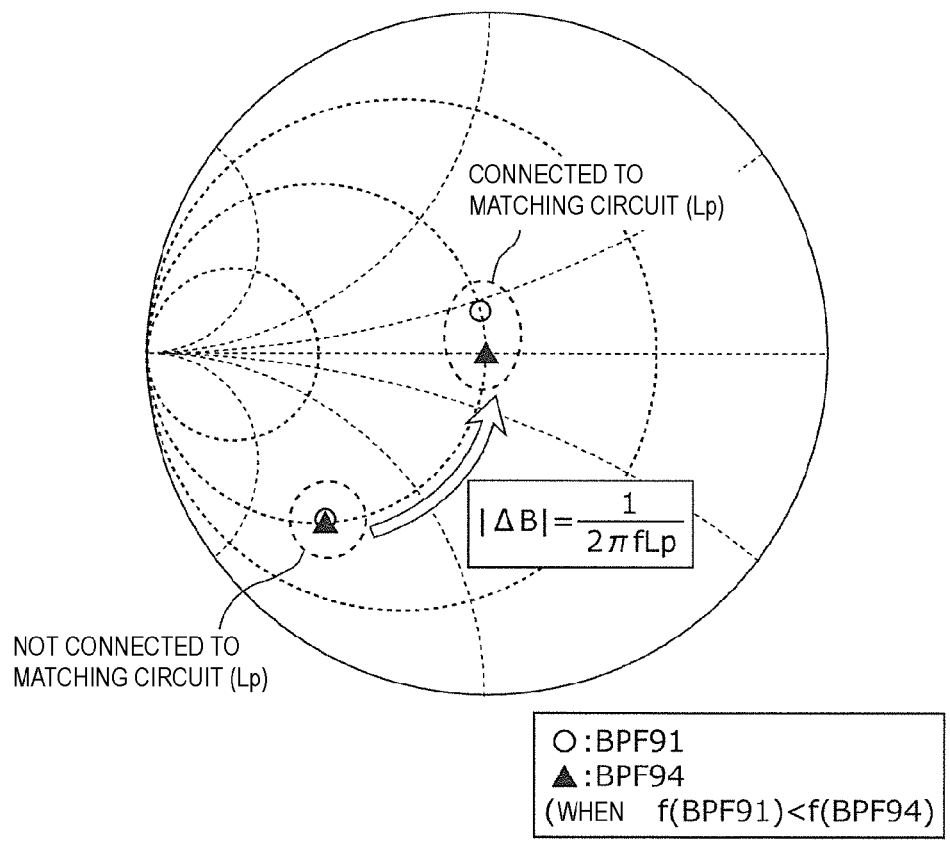

FIG. 5A
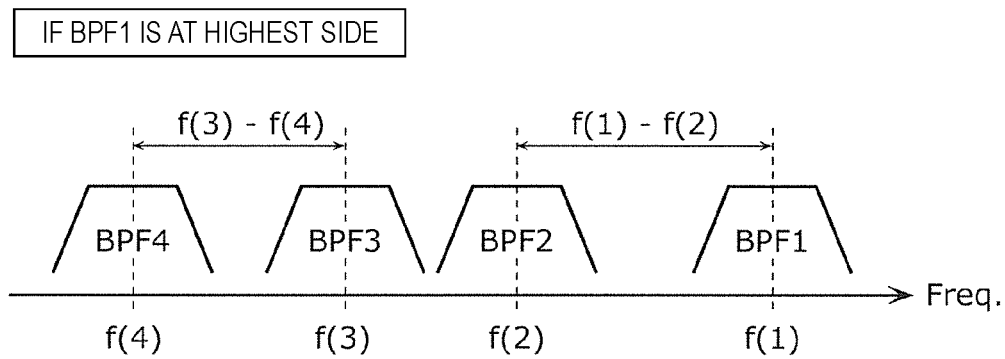
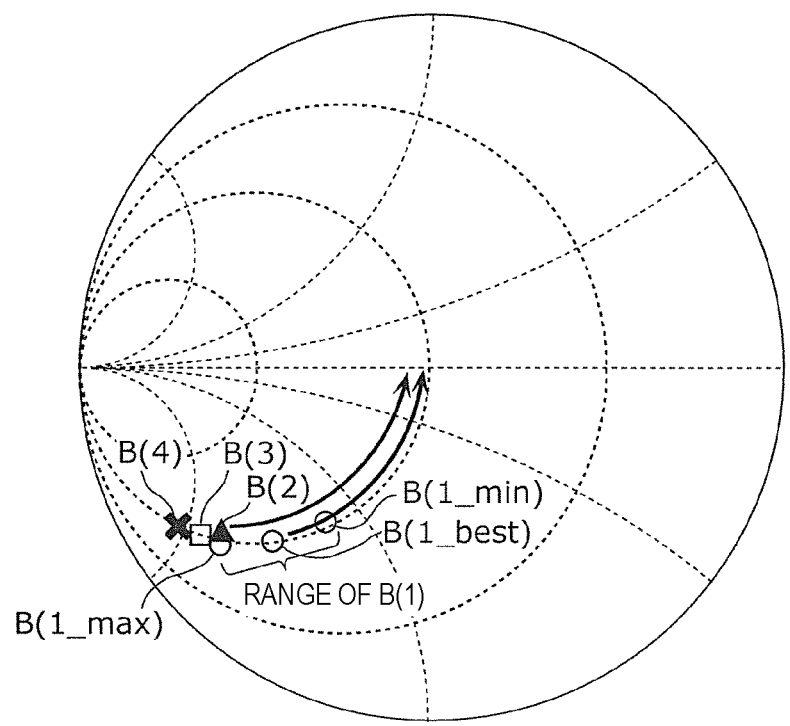

FIG. 5B
IF BPF1 IS AT LOWEST SIDE
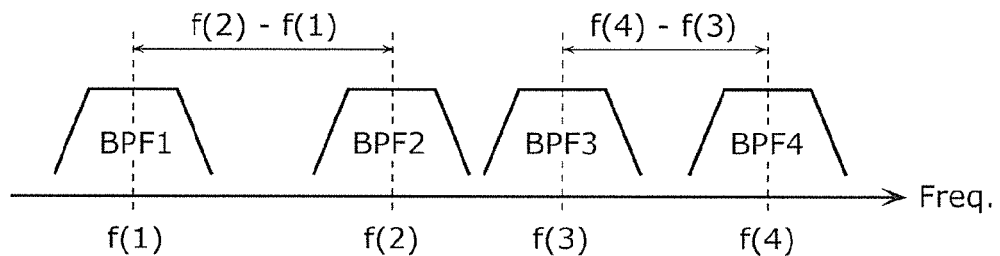
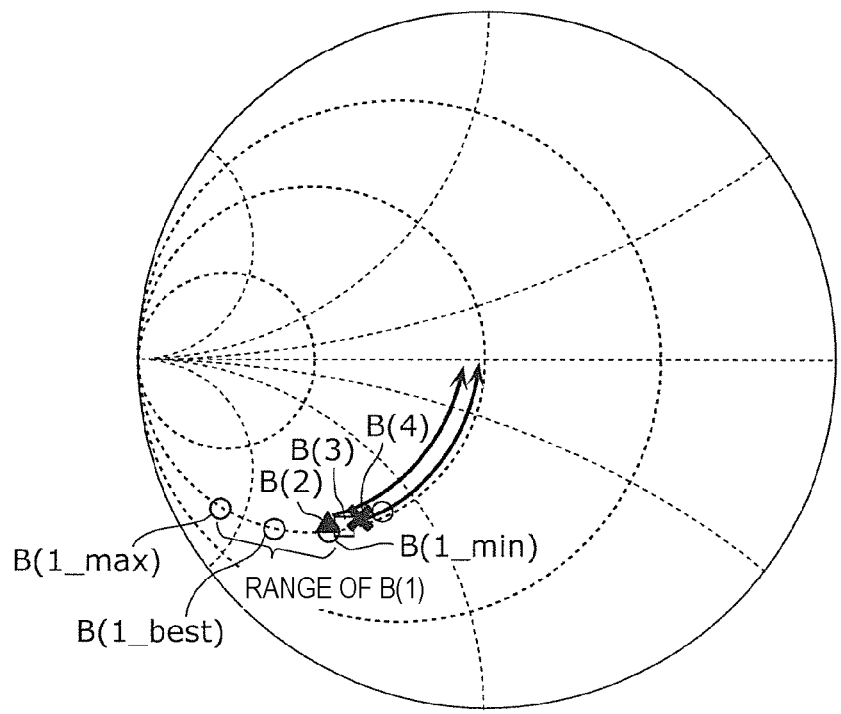

WAVE SEPARATOR

BACKGROUND OF THE INVENTION

1. Field of the Invention

The present invention relates to a wave separator.

2. Description of the Related Art

In recent years, a cellular phone is requested to comply with a plurality of frequency bands and a plurality of wireless systems, or so-called multi-band and multi-mode by a single terminal alone. Therefore, as a module compliant with the multi-band and multi-module, there is suggested a configuration including two duplexers having different frequency bands, respective antenna terminals of the two duplexers being connected to a common antenna terminal of the module (for example, see Japanese Unexamined Patent Application Publication No. 2010-45563).

However, with the above-described configuration, impedance matching (matching) is optimized on a duplexer-specific basis, i.e., duplexer-by-duplexer. If the antenna terminals of the duplexers are connected to the common antenna terminal to configure a multiplexer or a wave separator, it is difficult to obtain good impedance matching. Hence, with such a configuration, bandpass loss and return loss may be increased.

SUMMARY OF THE INVENTION

Accordingly, preferred embodiments of the present invention provide wave separators that decrease bandpass loss and return loss.

According to a preferred embodiment of the present invention, a wave separator includes an n number (n being a natural number of 3 or larger) of band pass filters having an n number or larger of mutually different pass bands; and a common terminal commonly provided for the n number of band pass filters. Among the n number of band pass filters, for a first band pass filter that is one of a band pass filter having a center frequency of a pass band at a lowest side and a band pass filter having a center frequency of a pass band at a highest side and that has a larger or equal difference in a center frequency of a pass band from an adjacent band pass filter as compared with the other band pass filter, when $f(1)$ is a center frequency of a pass band and $B(1)$ is a susceptance value with the center frequency viewed from the common terminal, and among the n number of band pass filters, for a second band pass filter having a pass band adjacent to the first band pass filter, when $f(2)$ is a center frequency of a pass band and $B(2)$ is a susceptance value with the center frequency viewed from the common terminal, the first band pass filter satisfies one of a configuration (i) and a configuration (ii) for the second band pass filter as follows:

(i) $B(2) \times \{2 \times f(2) - f(1)\}/f(1) < B(1) < B(2)$ if the first band pass filter is the band pass filter at the highest side, and (ii) $B(2) < B(1) < B(2) \times \{2 \times f(2) - f(1)\}/f(1)$ if the first band pass filter is the band pass filter at the lowest side.

With such a configuration, good impedance matching is obtained for each of the first band pass filter and the second band pass filter having the pass band adjacent to the first band pass filter by the common matching circuit. Accordingly, the bandpass loss and return loss are decreased.

Also, among the n number of band pass filters, for a k-th ($2 \leq k \leq n$) band pass filter, when $f(k)$ is a center frequency of a pass band, and $B(k)$ is a susceptance value with the center frequency viewed from the common terminal, the first band pass filter may satisfy one of a configuration (iii) and a configuration (iv) for each of the second to n-th band pass filters as follows:

(iii) $B(k) \times \{2 \times f(k) - f(1)\}/f(1) < B(1) < B(k)$ if the first band pass filter is the band pass filter at the highest side, and (iv) $B(k) < B(1 < B(k) \times \{2 \times f(k) - f(1)\}/f(1)$ if the first band pass filter is the band pass filter at the lowest side.

With such a configuration, good impedance matching is obtained for each of the first to n-th band pass filters by the common matching circuit. Accordingly, the bandpass loss and return loss are further decreased.

Also, the first band pass filter may be an elastic wave filter including a series arm resonator connected to the common terminal.

As described above, by providing the series arm resonator connected to the common terminal, flexibility in design of matching is increased. To be specific, by adjusting the number of pairs of electrode fingers of IDT electrodes of the series arm resonator, the series capacitance component of the first band pass filter is able to be adjusted, and hence the first band pass filter satisfying one of the above-described configuration (i) and configuration (ii) is easily fabricated.

Also, the first band pass filter may further include a parallel arm resonator connected between one of nodes of the series arm resonator and a reference terminal.

Herein, in general, with an elastic wave filter, the attenuation in a pass band and the characteristics of a suppression band may vary when the capacitance component of the series arm resonator is changed. Thus, by providing the parallel arm resonator, the matching and attenuation are stabilized.

Also, the wave separator may further include a matching circuit connected to the common terminal, and the first band pass filter may satisfy one of the configuration (i) and the configuration (ii) for the second band pass filter without matching by the matching circuit.

Accordingly, the bandpass loss and return loss are decreased without an externally provided matching circuit.

Also, the matching circuit may be an inductor having one end connected to the common terminal and the other end connected to the reference terminal, the inductor may be embedded in a multilayer substrate, and the n number of band pass filters may be mounted on the multilayer substrate.

Accordingly, the size is reduced and the bandpass loss and return loss are decreased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 provides an illustration for describing a problem occurring when a common matching circuit is connected to a typical multiplexer.

FIG. 5A provides an illustration for describing an example of a configuration discovered by the inventors according to the first preferred embodiment of the present invention.

FIG. 5B provides an illustration for describing other example of the configuration discovered by the inventors according to the first preferred embodiment of the present invention.

DETAILED DESCRIPTION OF THE PREFERRED EMBODIMENTS

Figure 1:
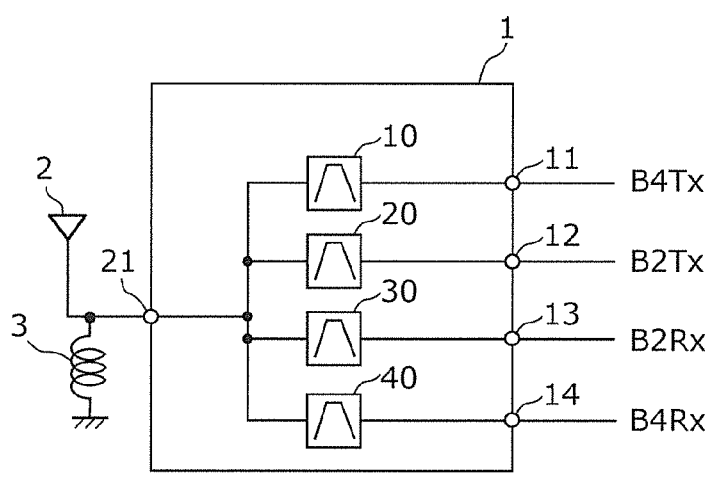
FIG. 1 is a general configuration diagram of a multiplexer according to a first preferred embodiment of the present invention.

Preferred embodiments of the present invention are described below in detail with reference to the drawings. Any of the preferred embodiments described below provides a comprehensive or specific example. Numerical values, shapes, materials, components, arrangement and connection form of the components, a manufacturing method, and the order in the manufacturing method, etc., described in the following preferred embodiments are merely examples, and are not intended to limit the present invention. Elements and features not recited in the independent claim among elements and features described in the following preferred embodiments are arbitrary components. Also, the sizes and the ratio of sizes of components shown in the drawings are not necessarily required or limiting. Also, in the following preferred embodiments, an expression "be connected to" includes not only direct connection, but also electric connection through other elements or the like.

Also, in the following preferred embodiments, a multiplexer is described as an example of a wave separator including an n number (n being a natural number of 3 or larger) of band pass filters having an n number or larger of mutually different pass bands, and a common terminal commonly provided for the n number of band pass filters.

First Preferred Embodiment

A multiplexer according to this preferred embodiment includes an n number (n being a natural number of 3 or larger) of band pass filters having an n number or larger of mutually different pass bands, and a common terminal commonly provided for the n number of band pass filters.

FIG. 1 is a general configuration diagram of a multiplexer 1 according to this preferred embodiment. The drawing also shows an antenna 2 and an inductor 3 connected to a common terminal 21 of the multiplexer 1.

As shown in the drawing, in this preferred embodiment, the multiplexer 1 preferably includes four band pass filters 10 to 40 having four mutually different pass bands, and the common terminal 21. The multiplexer 1 is, for example, a quadplexer that is applied to Band2 (transmission pass band: 1850 MHz to 1910 MHz, reception pass band: 1930 MHz to 1990 MHz) and Band4 (transmission pass band: 1710 MHz to 1755 MHz, reception pass band: 2110 MHz to 2155 MHz).

The band pass filter 10 is an unbalanced input-unbalanced output transmission filter that filters a transmission wave generated by a transmission circuit (radio frequency integrated circuit (RFIC) or the like) and input from a transmission input terminal 11 in the transmission pass band of Band4 (1710 MHz to 1755 MHz) and outputs the filtered transmission wave to the common terminal 21.

A band pass filter 20 is an unbalanced input-unbalanced output transmission filter that filters a transmission wave generated by a transmission circuit (RFIC or the like) and input from a transmission input terminal 12 in the transmission pass band of Band2 (1850 to 1910 MHz) and outputs the filtered transmission wave to the common terminal 21.

The band pass filter 30 is an unbalanced input-unbalanced output reception filter that filters a reception wave input from the common terminal 21 in the reception pass band of Band2 (1930 MHz to 1990 MHz) and outputs the filtered reception wave to a reception output terminal 13.

The band pass filter 40 is an unbalanced input-unbalanced output reception filter that filters a reception wave input from the common terminal 21 in the reception pass band of Band4 (2110 MHz to 2155 MHz) and outputs the filtered reception wave to a reception output terminal 14.

In this preferred embodiment, the band pass filters 10 to 40 include surface acoustic wave filters using a surface acoustic wave (SAW). The configurations of the band pass filters 10 to 40 each are not limited to the elastic wave filter using SAW, and may include an elastic wave filter using a bulk acoustic wave (BAW). Also, without limiting to the elastic wave filter, a filter including a chip inductor and a chip capacitor may be used.

A structure of a resonator defining a surface acoustic wave filter will now be described.

Figure 2:
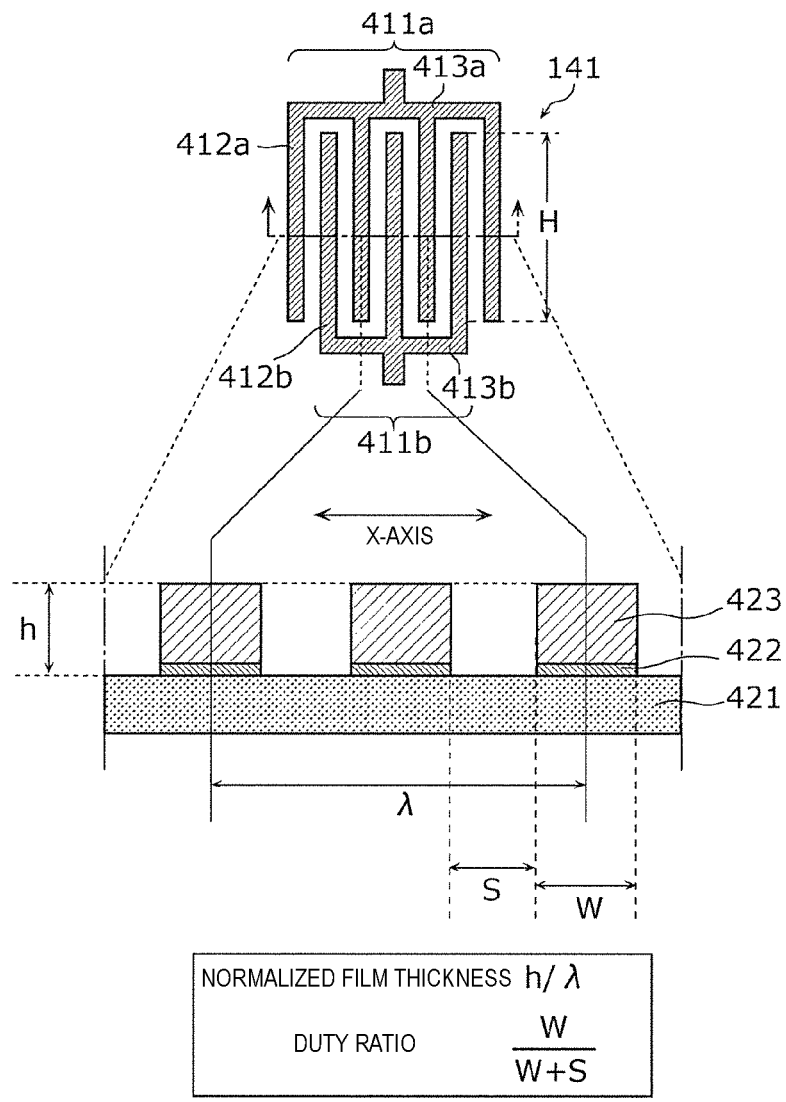
FIG. 2 provides a plan view and a cross-sectional view schematically showing a resonator of a surface acoustic wave filter according to the first preferred embodiment of the present invention.

FIG. 2 provides a plan view and a cross-sectional view schematically showing a resonator of a surface acoustic wave filter according to this preferred embodiment. The drawing exemplarily provides a schematic plan view and a schematic cross-sectional view showing a structure of a series arm resonator 141 (see FIG. 3, described later) among a plurality of resonators of the band pass filter 40. It is to be noted that the series arm resonator 141 shown in FIG. 2 is for describing a typical structure of the plurality of resonators, and hence the number of pairs and length of electrode fingers defining an electrode are not limited to those shown in FIG. 2.

The resonators of the band pass filters 10 to 40 each include a piezoelectric substrate 421, and interdigital transducer (IDT) electrodes 411a and 411b each having a substantially comb shape.

As shown in the plan view in FIG. 2, a pair of mutually facing IDT electrodes 411a and 411b are located on the piezoelectric substrate 421. The IDT electrode 411a includes a plurality of electrode fingers 412a being parallel or substantially parallel to each other, and a busbar electrode 413a connecting the plurality of electrode fingers 412a. The IDT electrode 411b includes a plurality of electrode fingers 412b being parallel or substantially parallel to each other, and a busbar electrode 413b connecting the plurality of electrode fingers 412b. The plurality of electrode fingers 412a and 412b extend in a direction perpendicular or substantially perpendicular to the X-axis direction.

Also, the IDT electrodes 411a and 411b including the plurality of electrode fingers 412a and 412b and the busbar electrodes 413a and 413b have a multilayer structure including a close contact layer 422 and a main electrode layer 423 as shown in the cross-sectional view in FIG. 2.

The close contact layer 422 is a layer that increases adhesion between the piezoelectric substrate 421 and the main electrode layer 423, and uses, for example, Ti as a material. The main electrode layer 423 preferably uses, for example, Al containing Cu by 1% as a material.

The materials defining the close contact layer 422 and the main electrode layer 423 are not limited to the above-described materials. Further, the IDT electrodes 411a and 411b may not have the aforementioned multilayer structure. The IDT electrodes 411a and 411b may be made of, for example, a metal or an alloy selected from Ti, Al, Cu, Pt, Au, Ag, and Pd, or may be defined by a plurality of multilayer bodies made of the above metal or alloy. Also, a dielectric film may be located on the piezoelectric substrate 421 to cover the close contact layer 422 and the main electrode layer 423 to protect the electrodes or improve the characteristics.

The characteristics of the surface acoustic wave filter including the resonator such as the series arm resonator depend on the structure of the IDT electrodes of the resonator. Thus, for example, by adjusting the structure of the IDT electrodes, the band pass filters 10 to 40 compliant with the required specifications of the bandpass characteristics in respective frequency bands (Bands) are provided.

The structure of the IDT electrodes will now be described.

The wave length of the surface acoustic wave resonator is determined by a repetition pitch λ of the plurality of electrode fingers 412a and 412b of the IDT electrodes 411a and 411b shown in the middle section in FIG. 2. Also, an intersecting width H of the IDT electrodes is a length of electrode fingers by which the electrode fingers 412a of the IDT electrode 411a overlap the electrode fingers 412b of the IDT electrode 411b when viewed in the X-axis direction as shown in the upper section in FIG. 2. The X-axis direction extends parallel or substantially parallel to a propagation direction of a surface acoustic wave in a longitudinal mode excited at the piezoelectric substrate 421 by the IDT electrodes. Also, a duty ratio is a line width occupying percentage of the plurality of electrode fingers 412a and 412b, and is a ratio of a line width of the plurality of electrode fingers 412a and 412b to the sum of the line width and a space width of the plurality of electrode fingers 412a and 412b. To be more specific, the duty ratio is defined by W/(W+S) when W is a line width of each of the electrode fingers 412a and 412b of the IDT electrodes 411a and 411b, and S is a space width between adjacent electrode finger 412a and electrode finger 412b.

Next, configurations of the band pass filters 10 to 40 are described on the basis of, for example, the band pass filter 40.

Figure 3:
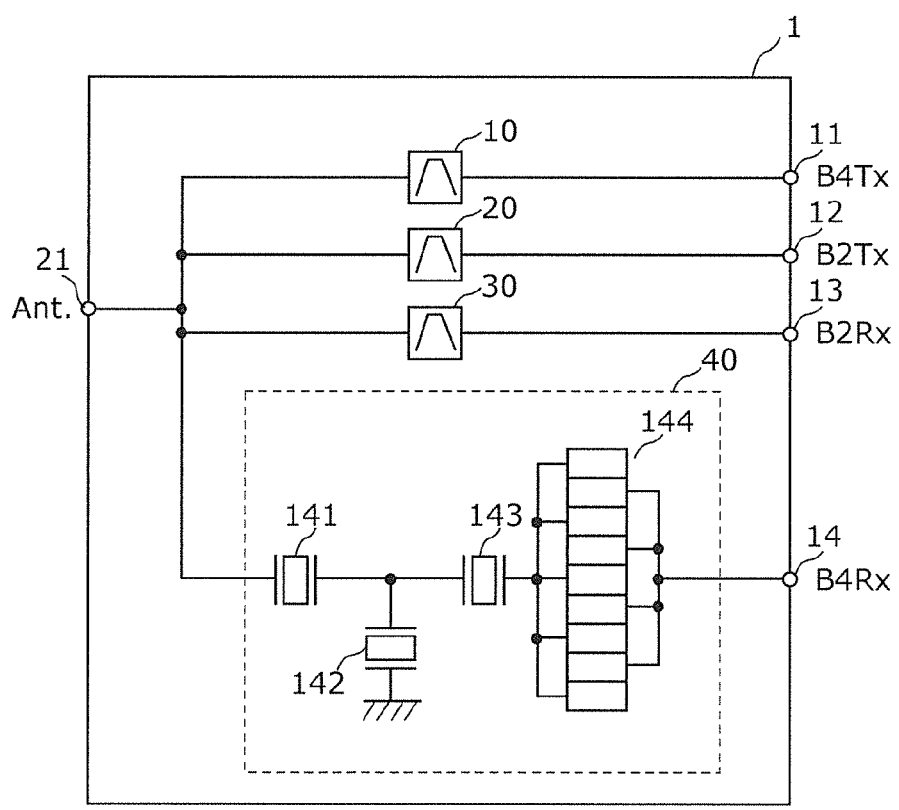
FIG. 3 is a general configuration diagram of the multiplexer showing a circuit configuration of a band pass filter according to the first preferred embodiment of the present invention.

FIG. 3 is a general configuration diagram of the multiplexer 1 showing the circuit configuration of the band pass filter 40 according to this preferred embodiment.

As shown in the drawing, the band pass filter 40 includes series arm resonators 141 and 143, a parallel arm resonator 142, and a longitudinally coupled type filter portion 144.

The series arm resonators 141 and 143 are connected in series between the common terminal 21 and the reception output terminal 14. The parallel arm resonator 142 is provided between a connection node of the series arm resonator 141 and the series arm resonator 143, and a reference terminal (ground). The series arm resonators 141 and 143, and the parallel arm resonator 142 connected as described above configure a ladder type band pass filter. The longitudinally coupled type filter portion 144 is provided between the series arm resonator 143 and the reception output terminal 14.

The circuit configuration of the band pass filter 40 is not limited to such a configuration, and may be any configuration that can satisfy the required specifications of the bandpass characteristics in the reception pass band of Band4. However, to ensure flexibility in design of impedance, the series arm resonator and the parallel arm resonator are preferably provided at the common terminal 21 side. That is, the band pass filter 40 preferably includes a series arm resonator or a parallel arm resonator connected to the common terminal 21 without other element interposed therebetween.

Also, for a specific circuit configuration of each of the band pass filters 10 to 30, a known arrangement configuration may be properly applied as long as the configuration can satisfy the required specifications of the bandpass characteristics in each frequency band. The arrangement configuration is, for example, the arranged number of the series arm resonators and parallel arm resonators, and selection of a filter configuration such as ladder type or longitudinally coupled type.

This preferred embodiment has a feature that a band pass filter having the farthest center frequency of a pass band satisfies a predetermined configuration described below in detail to decrease bandpass loss and return loss. To be more specific, since the multiplexer 1 according to this preferred embodiment is applied to Band2 and Band4, the band pass filter 40 being the reception filter of Band4 is the band pass filter having the farthest center frequency of the pass band. Hence, the band pass filter 40 is designed to satisfy the predetermined configuration.

Hereinafter, the circumstances in which the inventors developed preferred embodiments of the present invention for the configuration satisfied by the band pass filter having the farthest center frequency of the pass band is described below.

FIG. 4 provides illustrations for describing a problem occurring when a common matching circuit is connected to a typical multiplexer. To be specific, the upper section of the drawing provides a configuration of a multiplexer according to a comparative example. Also, the lower section in the drawing provides an admittance chart indicative of an impedance viewed from a common terminal 921 without a common matching circuit connected according to the comparative example (not connected to matching circuit (Lp) in the drawing), and an impedance viewed from the common terminal 921 with the common matching circuit connected (connected to matching circuit (Lp) in the drawing).

The multiplexer according to the comparative example has three or more band pass filters having three or more mutually different pass bands. However, the drawing shows a band pass filter 910 having a pass band of a first pass band (BPF91) and a band pass filter 940 having a pass band of a second pass band (BPF94).

These band pass filters 910 and 940 are commonly connected to a common terminal 921 and an inductor 903 being a common matching circuit. In this case, the inductor 903 is a so-called parallel inductor having one end connected to the common terminal 921 and the other end connected to the ground.

As shown in the drawing, since the inductor 903 serving as the matching circuit is connected, the impedances of the band pass filters 910 and 940 move to inductance on an equiconductance circle. That is, since the inductor 903 is connected, the susceptance values of the band pass filters 910 and 940 are decreased.

A variation ΔB in the susceptance value at this time is expressed by $1/(2\pi f L_p)$ when $L_p$ is an inductance value of the inductor 903 and f is a center frequency of a pass band.

As described above, since the variation ΔB in the susceptance value depends on the frequency, the following problem arises between the band pass filter 910 and the band pass filter 940 having equivalent impedances without the matching circuit connected. That is, if one of the impedances is adjusted to match the characteristic impedance of, for example, about 50Ω, the other impedance is deviated from the characteristic impedance, and hence impedance mismatching may occur.

Such impedance mismatching is particularly noticeable in a filter having a pass band far from the other filters because the variation ΔB in the susceptance value depends on the frequency.

Therefore, the inventors discovered that the impedance mismatching of the band pass filter is decreased by setting the susceptance value of the band pass filter having the farthest pass band within a predetermined range in the multiplexer provided with the parallel inductor as the common matching circuit, and conceived of the configuration described below.

Hereinafter, the configuration that decreases the impedance mismatching, discovered and conceived of by the inventors, is described.

FIGS. 5A and 5B are illustrations for describing the configuration discovered and conceived of by the inventors. To be specific, FIG. 5A is an illustration for describing a configuration to be satisfied if the band pass filter having the farthest pass band is a band pass filter at a highest side. FIG. 5B is an illustration for describing a configuration to be satisfied if the band pass filter having the farthest pass band is a band pass filter at a lowest side. Also, in each of FIGS. 5A and 5B, pass bands of four band pass filters (hereinafter, BPF1 to BPF4) are schematically shown in the upper section, and an admittance chart for describing the range of the susceptance value is shown in the lower section.

The pass bands of BPF1 to BPF4 and the center frequencies (f(1) to f(4)) of the pass bands shown in FIG. 5A and the pass bands of BPF1 to BPF4 and the center frequencies (f(1) to f(4)) of the pass bands shown in FIG. 5B have different magnitude relationships of frequency for simplifying the description on the configuration (described later).

First, the definition of the filter having the farthest pass band is described with reference to FIGS. 5A and 5B.

In this preferred embodiment, "the filter having the farthest pass band" is, among an n number of band pass filters, a band pass filter that is one of a band pass filter having a center frequency of a pass band at a lowest side and a band pass filter having a center frequency of a pass band at a highest side and that has a larger or equal difference in a center frequency of a pass band from an adjacent band pass filter as compared with the other band pass filter.

That is, in the example shown in FIG. 5A, among the BPF1 to BPF4 (when the relationship among the center frequencies of the respective band pass filters satisfies BPF4<BPF3<BPF2<BPF1), the BPF4 at the lowest side or the BPF1 at the highest side is a candidate for "the filter having the farthest pass band." Herein, a difference f(1)−f(2) between the center frequency f(1) of the BPF1 and the center frequency f(2) of the BPF2 adjacent to the BPF1 is compared with a difference f(3)−f(4) between the center frequency f(4) of the BPF4 and the center frequency f(3) of the BPF3 adjacent to the BPF4. Consequently, if a condition (f(1)−f(2))≥(f(3)−f(4)) is satisfied, the BPF1 at the highest side is defined as the band pass filter having the farthest pass band.

Also, in the example shown in FIG. 5B, among the BPF1 to BPF4 (when the relationship among the center frequencies of the respective band pass filters satisfies BPF1<BPF2<BPF3<BPF4), the BPF1 at the lowest side or the BPF4 at the highest side is a candidate for "the filter having the farthest pass band." Herein, a difference f(4)−f(3) between the center frequency f(4) of the BPF4 and the center frequency f(3) of the BPF3 adjacent to the BPF4 is compared with a difference f(2)−f(1) between the center frequency f(1) of the BPF1 and the center frequency f(2) of the BPF2 adjacent to the BPF1. Consequently, if a condition (f(2)−f(1))≥(f(4)−f(3)) is satisfied, the BPF1 at the lowest side is defined as the band pass filter having the farthest pass band.

In the following description, among the n number of band pass filters, the band pass filter having the farthest pass band defined as described above defines and functions as a first band pass filter, and then band pass filters having pass bands adjacent to the first band pass filter are sequentially described as k-th band pass filters (2≤k≤n).

Also, a configuration in which a matching circuit of a multiplexer is commonly provided for an n number of band pass filters is expected and described below, and in particular, a configuration to which a parallel inductor is applied as the matching circuit is expected and described below. In the following description, an impedance represents an impedance in a view of a multiplexer side from a common terminal unless otherwise noted.

First, a predetermined configuration for decreasing bandpass loss and return loss if the band pass filter having the farthest pass band (the first band pass filter) is a band pass filter at the highest side will be described.

If a parallel inductor is used as a matching circuit, a variation $\Delta B(1)$ in a susceptance (an imaginary part of an admittance) of the first band pass filter by the provision of the parallel inductor is expressed as follows:

$$|\Delta B(1)|=1/\{2\pi f(1)Lp\} \qquad \text{Expression (1)},$$

where f(1) is a center frequency of a pass band of the first band pass filter, and Lp is an inductance value of the parallel inductor provided as the matching circuit common to the n number of band pass filters.

In a view from the common terminal, to optimize matching of the first band pass filter, it is the most preferable that the susceptance value with the matching circuit is 0. Hence, an optimal value B(1_best) of the susceptance value of the first band pass filter without the matching circuit is expressed as follows:

$$B(1\_\text{best})=|\Delta B(1)|=1/\{2\pi f(1)Lp\} \qquad \text{Expression (2)}.$$

Similarly, if a parallel inductor is used as a matching circuit, a variation $\Delta B(2)$ in a susceptance of a second band pass filter by the provision of the parallel inductor is expressed as follows:

$$|\Delta B(2)|=1/\{2\pi f(2)Lp\} \qquad \text{Expression (3)},$$

where f(2) is a center frequency of a pass band of the second band pass filter.

Even for the second band pass filter, similarly to the first band pass filter, in a view from the common terminal, to optimize matching, it is the most preferable that the susceptance value with the matching circuit is 0. Hence, an optimal value B(2) of the susceptance value of the second band pass filter without the matching circuit is expressed as follows:

$$B(2)=|\Delta B(2)|=1/\{2\pi f(2)Lp\} \qquad \text{Expression (4)}.$$

As described above, Lp is an inductance value of the parallel inductor provided as the common matching circuit.

Hence, by solving Expression (4) for Lp, and substituting Lp to Expression (1), the optimal value B(1_best) of the susceptance value of the first band pass filter is expressed as follows by using the optimal value B(2) of the susceptance value of the second band pass filter:

$$B(1\_\text{best})=\{f(2)/f(1)\}\times B(2) \qquad \text{Expression (5)}.$$

Accordingly, by setting the susceptance value of the first band pass filter at $\{f(2)/f(1)\}\times B(2)$ without the matching circuit, the following advantageous effect is attained. That is, optimal matching is obtained by the parallel inductor being the common matching circuit, for each of the first band pass filter having the greatest difficulty in matching and the second band pass filter.

Herein, since the center frequencies of the pass bands of the first and second band pass filters satisfy the condition of f(1)>f(2), the variations in the susceptances by the provision of the parallel inductor satisfy the condition of $|\Delta B(1)|<|\Delta B(2)|$.

Accordingly, to decrease the degree of mismatching in the state with the matching circuit, the susceptance value of the first band pass filter without the matching circuit is preferably smaller than the optimal value B(2) of the susceptance value of the second band pass filter. Hence, a maximum value B(1_max) of the susceptance value of the first band pass filter without the matching circuit is expressed as follows:

$$B(1\_\text{max})<B(2) \qquad \text{Expression (6)}.$$

That is, to decrease the degree of mismatching in the state with the matching circuit, the range of the susceptance value B(1) of the first band pass filter without the matching circuit is defined in a range of allowable values smaller than B(2)−B(1 best) with respect to the optimal value B(1_best).

Hence, a minimum value B(1_min) of the susceptance value of the first band pass filter without the matching circuit is expressed as follows:

$$B(1\_\text{min})>B(1\_\text{best})-\{B(2)-B(1\_\text{best})\}=2B(1\_\text{best})-B(2)=2\times\{f(2)/f(1)\}\times B(2)-B(2)=B(2)\times\{2\times f(2)-f(1)\}/f(1) \qquad \text{Expression (7)}.$$

With regard to Expressions (6) and (7) described above, the inventors discovered that the degree of mismatching is able to be decreased if the first band pass filter satisfies a predetermined configuration without the matching circuit. That is, to decrease bandpass loss and return loss, the inventors conceived of an idea of providing a band pass filter as the band pass filter having the farthest pass band (the first band pass filter) that satisfies the following configuration for an adjacent band pass filter (the second band pass filter).

That is, among an n number of band pass filters, for a first band pass filter (in this case, BPF1) that is one of a band pass filter having a center frequency of a pass band at a lowest side and a band pass filter having a center frequency of a pass band at a highest side and that has a larger or equal difference in a center frequency of a pass band from an adjacent band pass filter as compared with the other band pass filter, it is assumed that f(1) is a center frequency of a pass band and B(1) is a susceptance value with the center frequency viewed from a common terminal in a state without a matching circuit. Also, among the n number of band pass filters, for a second band pass filter (in this case, BPF2) having a pass band adjacent to the first band pass filter, it is assumed that f(2) is a center frequency of a pass band and B(2) is a susceptance value with the center frequency viewed from the common terminal in the state without the matching circuit.

At this time, the first band pass filter satisfies a configuration (i) as follows for the second band pass filter:

a configuration (i) $B(2)\times\{2\times f(2)-f(1)\}/f(1)<B(1)<B(2)$ if the first band pass filter is the band pass filter at the highest side.

By providing the first band pass filter satisfying this configuration (i), if the first band pass filter is the band pass filter at the highest side, good matching is obtained by the common matching circuit for each of the first band pass filter having the greatest difficulty in matching, and the second band pass filter.

Herein, "good matching" or "good impedance matching" represents that the voltage standing wave ratio (VSWR) in each frequency band (Band) is small, and in this preferred embodiment, represents that the VSWR is smaller than a value corresponding to the required specifications of the bandpass characteristics (for example, smaller than 2.0).

Also, the inventors discovered that, if the first band pass filter satisfies the following configuration for a k-th (2≤k≤n) band pass filter among the n number of band pass filters, the degree of mismatching is able to be further decreased.

That is, for the k-th (2≤k≤n) band pass filter among the n number of band pass filters, it is assumed that f(k) is a center frequency of a pass band, and B(k) is a susceptance value with the center frequency viewed from the common terminal.

At this time, the first band pass filter satisfies a configuration (iii) as follows for each of the second to n-th band pass filters:

a configuration (iii) $B(k) \times \{2 \times f(k) - f(1)\}/f(1) < B(1) < B(k)$ if the first band pass filter is the band pass filter at the highest side.

By providing the first band pass filter satisfying this configuration (iii), if the first band pass filter is the band pass filter at the highest side, good matching is obtained by the common matching circuit for each of the n number of band pass filters.

Next, a predetermined configuration to decrease bandpass loss and return loss if the band pass filter having the farthest pass band (the first band pass filter) is a band pass filter at the lowest side is described.

In the following description, the configuration is similar to the case in which the band pass filter at the highest side is the farthest band pass filter except for the magnitude relationship of the center frequencies of the pass bands of the band pass filters. Hence, the description is appropriately simplified or omitted.

The optimal value B(1_best) of the susceptance value of the first band pass filter is expressed by an expression as follows by using the optimal value B(2) of the susceptance value of the second band pass filter:

$$B(1\_best) = \{f(2)/f(1)\} \times B(2) \quad \text{Expression (8)},$$

where f(1) is a center frequency of a pass band of the first band pass filter, and f(2) is a center frequency of a pass band of the second band pass filter.

Herein, the center frequencies of the pass bands of the first and second band pass filters satisfy a condition of $f(1) < f(2)$. Hence, a variation $\Delta B(1)$ in the susceptance of the first band pass filter and a variation $\Delta B(2)$ in the susceptance of the second band pass filter by the provision of the parallel inductor as the matching circuit satisfy a condition of $|\Delta B(1)| > |\Delta B(2)|$.

Accordingly, to decrease the degree of mismatching in the state with the matching circuit, the susceptance value of the first band pass filter without the matching circuit is preferably larger than the optimal value B(2) of the susceptance value of the second band pass filter. Hence, a minimum value B(1_min) of the susceptance value of the first band pass filter without the matching circuit is expressed as follows:

$$B(1\_min) > B(2) \quad \text{Expression (9)}.$$

That is, to decrease the degree of mismatching in the state with the matching circuit, the range of the susceptance value B(1) of the first band pass filter without the matching circuit is defined in a range of allowable values smaller than B(1_best)−B(2) with respect to the optimal value B(1_best).

Hence, a maximum value B(1_max) of the susceptance value of the first band pass filter without the matching circuit is expressed as follows:

$$B(1\_max) < B(1\_best) + \{B(1\_best) - B(2)\} = 2B(1\_best) - B(2) = 2 \times \{f(2)/f(1)\} \times B(2) - B(2) = B(2) \times \{2 \times f(2) - f(1)\}/f(1) \quad \text{Expression (10)}.$$

With regard to Expressions (9) and (10) described above, the inventors discovered that the degree of mismatching is able to be decreased if the first band pass filter satisfies a predetermined configuration in the state without the matching circuit. That is, to decrease bandpass loss and return loss, the inventors conceived of an idea of providing a band pass filter as the band pass filter having the farthest pass band (the first band pass filter) that satisfies the following configuration for an adjacent band pass filter (the second band pass filter).

That is, among an n number of band pass filters, for a first band pass filter (in this case, BPF1) that is one of a band pass filter having a center frequency of a pass band at a lowest side and a band pass filter having a center frequency of a pass band at a highest side and that has a larger or equal difference in a center frequency of a pass band from an adjacent band pass filter as compared with the other band pass filter, it is assumed that f(1) is a center frequency of a pass band and B(1) is a susceptance value with the center frequency viewed from a common terminal in a state without a matching circuit. Also, among the n number of band pass filters, for a second band pass filter (in this case, BPF2) having a pass band adjacent to the first band pass filter, it is assumed that f(2) is a center frequency of a pass band and B(2) is a susceptance value with the center frequency viewed from the common terminal without the matching circuit.

At this time, the first band pass filter satisfies a configuration (ii) as follows for the second band pass filter:

a configuration (ii) $B(2) < B(1) < B(2) \times \{2 \times f(2) - f(1)\}/f(1)$ if the first band pass filter is the band pass filter at the lowest side.

By providing the first band pass filter satisfying this configuration, if the first band pass filter is the band pass filter at the lowest side, good matching is obtained by the common matching circuit for each of the first band pass filter having the greatest difficulty in matching, and the second band pass filter.

Also, the inventors discovered that, if the first band pass filter satisfies the following configuration for a k-th $(2 \leq k \leq n)$ band pass filter among the n number of band pass filters, the degree of mismatching is able to be further decreased.

That is, for the k-th $(2 \leq k \leq n)$ band pass filter among the n number of band pass filters, it is assumed that f(k) is a center frequency of a pass band, and B(k) is a susceptance value with the center frequency viewed from the common terminal.

At this time, the first band pass filter satisfies a configuration (iv) as follows for each of the second to n-th band pass filters:

a configuration (iv) $B(k) \times \{2 \times f(k) - f(1)\}/f(1) < B(1) < B(k)$ if the first band pass filter is the band pass filter at the lowest side.

By providing the first band pass filter satisfying this configuration (iv), if the first band pass filter is the band pass filter at the lowest side, good matching is obtained by the common matching circuit for each of the n number of band pass filters.

Next, for characteristics of the multiplexer according to this preferred embodiment, an example of this preferred embodiment is described as compared with a comparative example.

Figure 6:
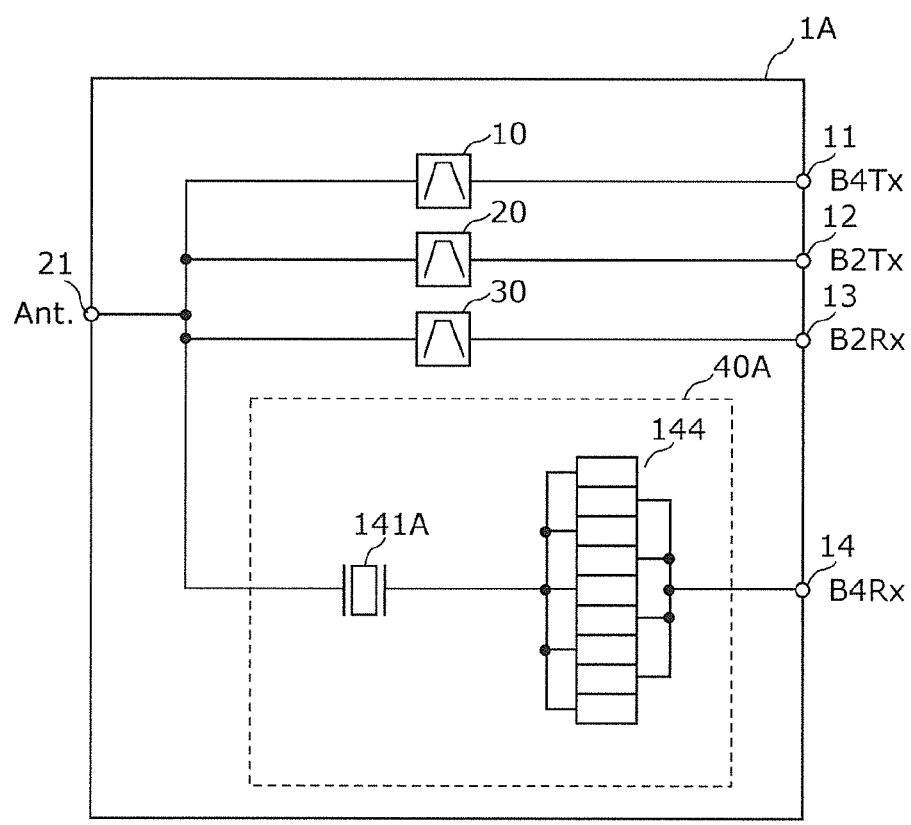
FIG. 6 is a general configuration diagram of a multiplexer according to a comparative example of the first preferred embodiment.

FIG. 6 is a general configuration diagram of a multiplexer 1A showing a circuit configuration of a band pass filter 40A according to the comparative example.

The multiplexer 1A according to the comparative example is a quadplexer in which a duplexer for Band2 and a duplexer for Band4 are connected by the common terminal 21. To be specific, as shown in FIG. 6, the comparative example is almost similar to the example except for the configuration of the band pass filter 40A (reception filter of Band4) having a pass band being the farthest from the other band pass filters. To be more specific, the band pass filter 40A according to the comparative example does not include the parallel arm resonator 142 or the series arm resonator 143 as compared with the band pass filter 40 according to the example.

Table 1 shows the details of the structure (the intersecting width H, the n number of pairs of electrode fingers of the IDT electrodes) of the series arm resonators 141 and 143 and the parallel arm resonator 142 of the band pass filter 40 according to the example, and the structure of a series arm resonator 141A of the band pass filter 40A according to the comparative example. The dimension of the intersecting width H is provided by micrometer (μm) and wave length ratio that is a multiplier of the wave length λ determined by the pitch of electrode fingers of the IDT electrodes. To be specific, in the IDTs of the series arm resonator 141, the intersecting width H is about 33 μm corresponding to about 18.4 times the wave length λ, and the number of pairs of electrode fingers is 100, for example.

TABLE 1

|  | Example | | | Comparative example |
| --- | --- | --- | --- | --- |
|  | Series arm resonator 141 | Parallel arm resonator 142 | Series arm resonator 143 | Series arm resonator 141A |
| Intersecting width H (μm) | about 33 | about 67 | about 30 | about 33 |
| Intersecting width H (wave length ratio) | 18.4 | 36.6 | 16.0 | 18.4 |
| N Number of electrode fingers of IDT electrodes | 100 | 120 | 35 | 80 |

The pitch λ and the duty ratio D are appropriately determined in accordance with the required specifications of the bandpass characteristics in the reception pass band of Band4. Also, the capacitance of each resonator is determined by the structure shown in Table 1 and, for example, the dielectric constant of the piezoelectric substrate 421.

Herein, in this preferred embodiment, by increasing or decreasing the number of pairs of electrode fingers of the IDT electrodes of the series arm resonator 141, the band pass filter 40 is formed to satisfy the above-described configuration (i).

To be specific, the band pass filter 40 includes the series arm resonator 141 connected to the common terminal 21. This series arm resonator 141 is connected to the common terminal 21 without other elements interposed therebetween. With this configuration, by increasing or decreasing the number of pairs of electrode fingers of the IDT electrodes of the series arm resonator 141, the capacitance component of the band pass filter 40 viewed from the common terminal 21 is able to be increased or decreased, and hence the susceptance value is able to be adjusted.

The method of adjusting the susceptance value is not limited to the aforementioned method. For example, adjustment may be made by parallel-connecting a capacitor to a resonator of the band pass filter 40, or by changing the electrode film thickness or the duty ratio of the resonator.

Also, in this preferred embodiment, the number of pairs of electrode fingers of the IDT electrodes is increased in the series arm resonator 141 according to the example as compared with the series arm resonator 141A according to the comparative example. The increase in the number of pairs of electrode fingers of the IDT electrodes in the series arm resonator 141 may decrease the attenuation of the band pass filter 40. Thus, in this preferred embodiment, the parallel arm resonator 142 is provided between one of nodes of the series arm resonator 141 and the reference terminal (ground). Accordingly, the decrease in attenuation is restricted.

Hereinafter, frequency characteristics of the multiplexer 1 according to the thus configured example are described in comparison with the multiplexer 1A according to the comparative example.

FIGS. 7A to 10B each are a Smith chart indicative of impedance of the multiplexer viewed from the common terminal 21 in the state with the common matching circuit at the common terminal 21 of the multiplexer. As the matching circuit according to the example, an inductor 3 with an inductance value of 1.6 nH having one end connected to the common terminal 21 and the other end connected to the ground was used. Also, as the matching circuit according to the comparative example, an inductor 3 with an inductance value of 1.7 nH having one end connected to the common terminal 21 and the other end connected to the ground was used.

Figure 7A:
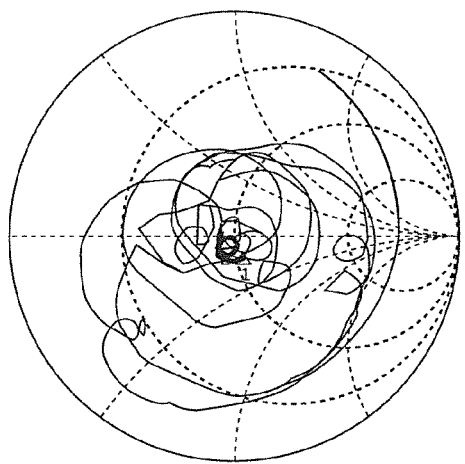
FIG. 7A is a Smith chart showing impedance in a transmission pass band of Band4 of a multiplexer according to an example of a preferred embodiment of the present invention.
Figure 7B:
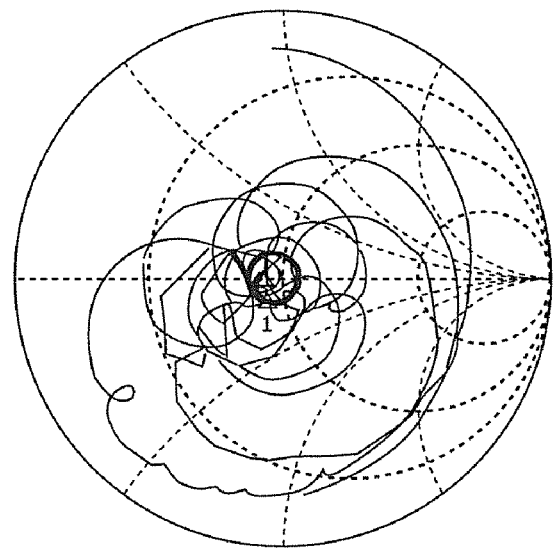
FIG. 7B is a Smith chart showing impedance in the transmission pass band of Band4 of a multiplexer according to a comparative example.
Figure 8A:
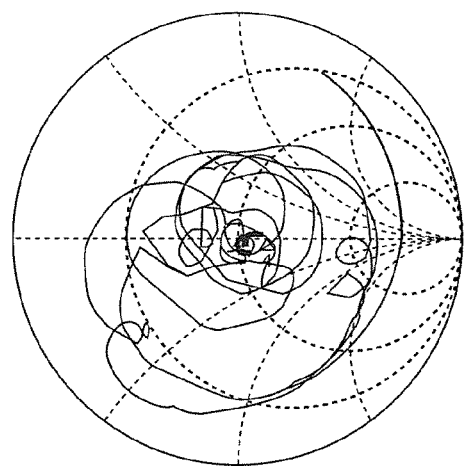
FIG. 8A is a Smith chart showing impedance in a transmission pass band of Band2 of the multiplexer according to the example of a preferred embodiment of the present invention.
Figure 8B:
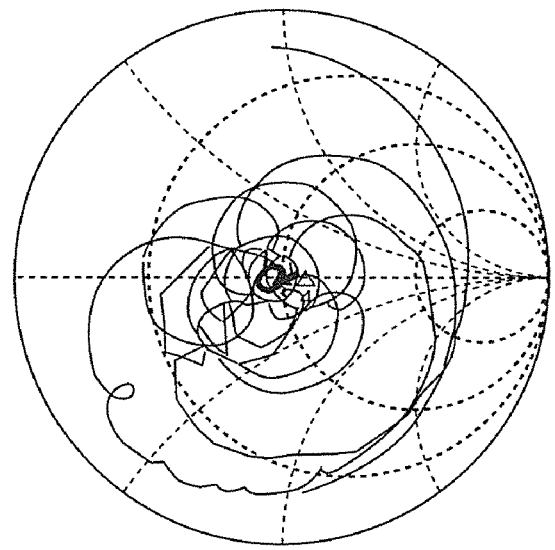
FIG. 8B is a Smith chart showing impedance in the transmission pass band of Band2 of the multiplexer according to the comparative example.
Figure 9A:
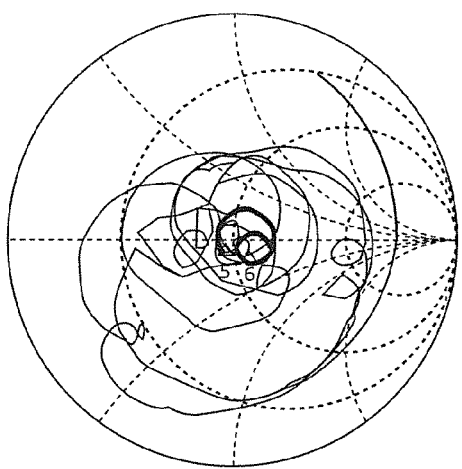
FIG. 9A is a Smith chart showing impedance in a reception pass band of Band2 of the multiplexer according to the example of a preferred embodiment of the present invention.
Figure 9B:
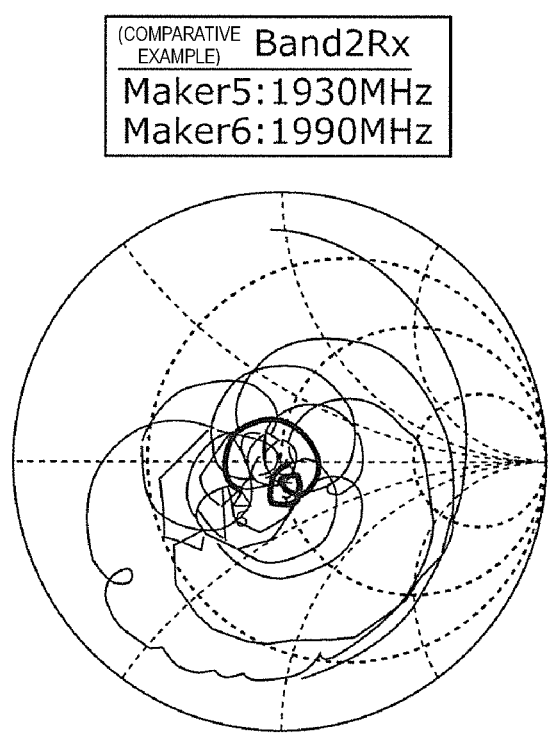
FIG. 9B is a Smith chart showing impedance in the reception pass band of Band2 of the multiplexer according to the comparative example.
Figure 10A:
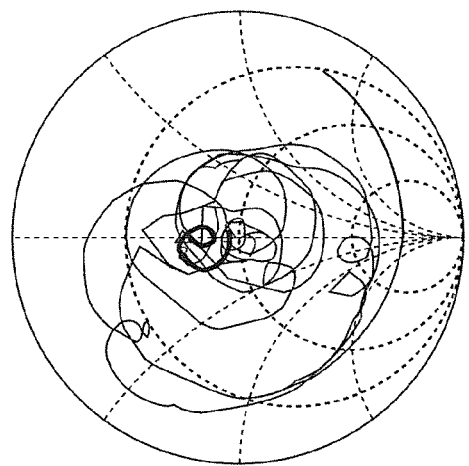
FIG. 10A is a Smith chart showing impedance in a reception pass band of Band4 of the multiplexer according to the example of a preferred embodiment of the present invention.

To be specific, FIG. 7A shows the impedance of the multiplexer 1 according to the example in the transmission pass band of Band4. Also, FIG. 7B shows the impedance of the multiplexer 1A according to the comparative example in the transmission pass band of Band4. Also, FIG. 8A shows the impedance of the multiplexer 1 according to the example in the transmission pass band of Band2. Also, FIG. 8B shows the impedance of the multiplexer 1A according to the comparative example in the transmission pass band of Band2. Also, FIG. 9A shows the impedance of the multiplexer 1 according to the example in the reception pass band of Band2. Also, FIG. 9B shows the impedance of the multiplexer 1A according to the comparative example in the reception pass band of Band2. Also, FIG. 10A shows the impedance of the multiplexer 1 according to the example in the reception pass band of Band4. Also, FIG. 10B shows the impedance of the multiplexer 1A according to the comparative example in the reception pass band of Band4.

These drawings each show the locus of the impedance in a band containing four pass bands (for example, 1500 MHz to 2300 MHz). In each drawing, the locus of the pass band (Band) in the drawing is indicated by a thick line.

As shown in FIGS. 7A to 9B, it is discovered that the multiplexer 1 according to the example maintains good impedance matching in the transmission pass band of Band4 and the transmission and reception pass bands of Band2 as compared with the comparative example. That is, according to the example, even if the band pass filter 40 is configured to satisfy the above-described configuration (i), the impedance matching of the other band pass filters 10 to 30 is maintained.

Figure 10B:
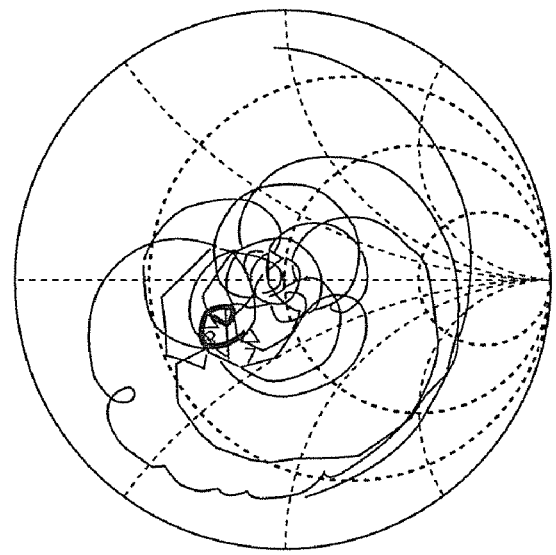
FIG. 10B is a Smith chart showing impedance in the reception pass band of Band4 of the multiplexer according to the comparative example.

Also, as shown in FIGS. 10A and 10B, it is discovered that the multiplexer 1 according to the example has good impedance matching in the reception pass band of Band4 as compared with the comparative example. That is, according to the example, since the band pass filter 40 is adjusted to satisfy the above-described configuration (i), the impedance mismatching of the band pass filter 40 is decreased.

As described above, with the multiplexer 1 according to the example, for the band pass filter 40 having the farthest pass band among the four band pass filters 10 to 40, the impedance mismatching of the other band pass filters 10 to 30 is able to be decreased while the impedance matching is maintained.

To be specific, the multiplexer 1A according to the comparative example is configured by connecting a duplexer for Band1 and a duplexer for Band4 through the common terminal 21. Herein, a duplexer is generally provided to attain impedance matching by a common matching circuit in a state in which the susceptance of own pass band and one target pass band are matched to two bands (reception pass band and transmission pass band). Hence, impedance mismatching may occur in the multiplexer 1A configured by combining such duplexers.

In contrast, since the band pass filter 40 satisfies the above-described configuration (i), the multiplexer 1 according to the example decreases the impedance mismatching.

Figure 11:
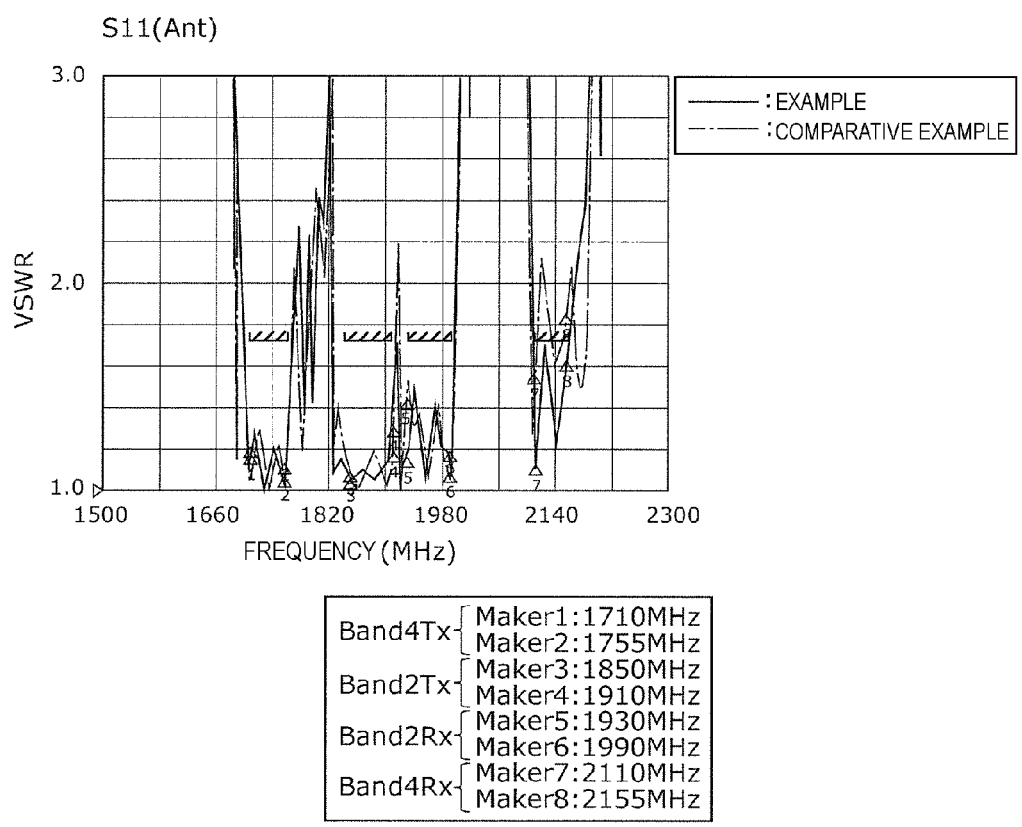
FIG. 11 is a graph showing the voltage standing wave ratios (VSWR) at the common terminal side of the multiplexers according to the example and comparative example.

FIG. 11 is a graph showing the VSWRs at the common terminal 21 side of the multiplexers according to the example and comparative example.

As shown in the drawing, it is discovered that the VSWR is degraded in the reception pass band of Band4 according to the comparative example. This is because good impedance matching cannot be obtained by the configuration according to the comparative example as shown in FIG. 10B.

In contrast, it is discovered that the multiplexer 1 according to the example obtains good VSWR even in the reception pass band of Band4 as compared with the comparative example. That is, according to the example, since the band pass filter 40 is provided to satisfy the above-described configuration (i), the impedance mismatching of the band pass filter 40 is decreased and hence the VSWR is improved.

Table 2 shows maximum values of VSWR in respective pass bands (transmission pass band of Band4: B4Tx, transmission pass band of Band2: B2Tx, reception pass band of Band2: B2Rx, reception pass band of Band4: B4Rx).

TABLE 2

|  | B4Tx | B2Tx | B2Rx | B4Rx |
|---|---|---|---|---|
| Example | 1.27 | 1.30 | 1.47 | 1.71 |
| Comparative example | 1.31 | 1.20 | 1.56 | 2.13 |

As shown in this table, according to the example, the VSWR is restricted to be 2.0 or smaller in all the four bands. Also, in the example, the VSWR of the reception pass band of Band4 is improved while the VSWRs of bands other than the reception pass band of Band4 are maintained at substantially equivalent levels as compared with the comparative example.

6. Conclusion

As described above, a multiplexer 1 according to this preferred embodiment includes an n number (n being a natural number of 3 or larger) of band pass filters having an n number or larger of mutually different pass bands (in this preferred embodiment, four band pass filters 10 to 40 having four pass bands), and a common terminal 21 commonly provided for the n number of band pass filters. Among the n number of band pass filters, a first band pass filter that is one of a band pass filter having a center frequency of a pass band at a lowest side and a band pass filter having a center frequency of a pass band at a highest side and that has a larger or equal difference in a center frequency of a pass band from an adjacent band pass filter as compared with the other band pass filter satisfies one of the above-described configuration (i) and configuration (ii) (in this preferred embodiment, the band pass filter 40 at the highest side satisfies the configuration (i)).

With this configuration, good impedance matching is able to be provided by the common matching circuit such as a parallel inductor (in this preferred embodiment, the inductor 3) for each of the first band pass filter and the second band pass filter having the pass band adjacent to the first band pass filter (in this preferred embodiment, the band pass filter 40 and the band pass filter 30). Accordingly, with the multiplexer 1 according to this preferred embodiment, the bandpass loss and return loss are decreased.

In general, in a multiplexer having an n number or larger of pass bands, bandpass loss and return loss are likely increased in a pass band at the highest side or the lowest side. Since the susceptance value of the band pass filter at the lowest side or the highest side satisfies one of the above-described configuration (i) and configuration (ii) and hence good impedance matching is provided by the common matching circuit, the bandpass loss and return loss are effectively decreased in the pass band in which the bandpass loss and return loss are likely increased.

Also, in the multiplexer 1 according to this preferred embodiment, the first band pass filter satisfies one of the above-described configuration (iii) and configuration (iv) for each of the second to n-th band pass filters (in this preferred embodiment, the band pass filter 40 at the highest side satisfies the configuration (iii) for the band pass filters 10 to 30).

With this configuration, good impedance matching is provided by the common matching circuit such as the parallel inductor for each of the first to n-th band pass filters (in this preferred embodiment, the band pass filters 10 to 40). Accordingly, with the multiplexer 1 according to this preferred embodiment, the bandpass loss and return loss are further decreased.

Also, with the multiplexer 1 according to this preferred embodiment, the first band pass filter (in this preferred embodiment, the band pass filter 40) preferably is an elastic wave filter (in this preferred embodiment, the surface acoustic wave filter) including the series arm resonator 141 connected to the common terminal 21.

As described above, by providing the series arm resonator 141 connected to the common terminal 21, the flexibility in design of matching is increased. To be specific, by adjusting the number of pairs of electrode fingers of the IDT electrodes of the series arm resonator 141, the series capacitance component of the first band pass filter (in this preferred embodiment, the band pass filter 40) is able to be adjusted, and hence the first band pass filter satisfying one of the above-described configuration (i) and configuration (ii) is able to be easily fabricated.

Also, in the multiplexer 1 according to this preferred embodiment, the parallel arm resonator 142 is provided between one of the nodes of the series arm resonator 141 and the reference terminal (ground).

Herein, in general, with an elastic wave filter, the attenuation in a pass band and the characteristics of a suppression band may vary if the capacitance component of the series arm resonator is changed. Thus, in this preferred embodiment, by providing the parallel arm resonator 142, the variation in characteristics is significantly reduced or prevented. The matching and attenuation are stabilized.

In this preferred embodiment, the multiplexer applied to Band2 and Band4 is described as an example of the multiplexer; however, the bands to be applied are not limited thereto. For example, Band1 (transmission pass band: 1920 MHz to 1980 MHz, reception pass band: 2110 MHz to 2170 MHz) and Band3 (transmission pass band: 1710 MHz to 1785 MHz, reception pass band: 1805 MHz to 1880 MHz) may be applied.

Also, in the multiplexer, the band pass filter may be the band pass filter at the lowest side having the farthest center frequency of the pass band. In this case, if the band pass filter 40 at the lowest side satisfies the above-described configuration (ii) and further configuration (iv), an advantageous effect similar to that of this preferred embodiment is attained.

Figure 12:
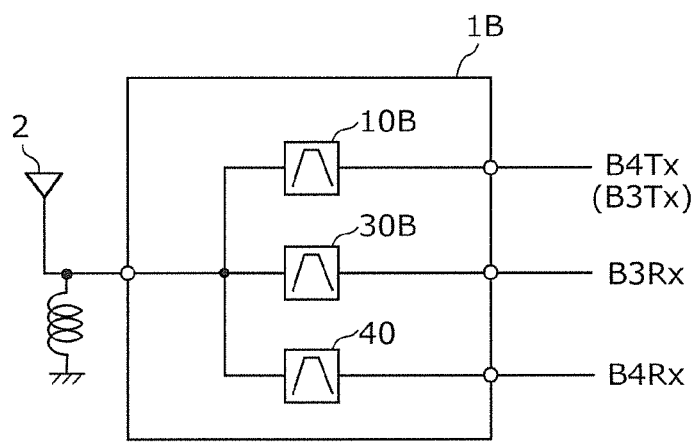
FIG. 12 is a general configuration diagram of a multiplexer according to a modification of the first preferred embodiment of the present invention.

Also, the multiplexer may be applied to a filter having three or more pass bands. FIG. 12 is a general configuration diagram of a multiplexer 1B according to a modification of this preferred embodiment. For example, as shown in FIG. 12, the multiplexer 1B that handles signals of Band3 and Band4 preferably defines a triplexer including a band pass filter 10B that executes filtering in transmission pass bands of Band3 and Band4, a band pass filter 30B that executes filtering in a reception band of Band3, and the band pass filter 40 that executes filtering in a reception band of Band4.

Also, the conductance (the imaginary part of the admittance) of each of the n number of band pass filters (in this preferred embodiment, four band pass filters 10 to 40) is not particularly limited. However, a normalized conductance is preferably in a range from about 0.7 to about 1.4 (inclusive), for example. By setting the normalized conductance within this range, the VSWR at the common terminal 21 side of the multiplexer 1 can be set at about 1.7 or smaller, for example.

Second Preferred Embodiment

In the above-described first preferred embodiment, the multiplexer 1 preferably is connected to the externally provided matching circuit such as the inductor 3. However, the multiplexer may include the matching circuit. That is, the multiplexer may be a multiplexer having embedded therein the matching circuit.

Figure 13:
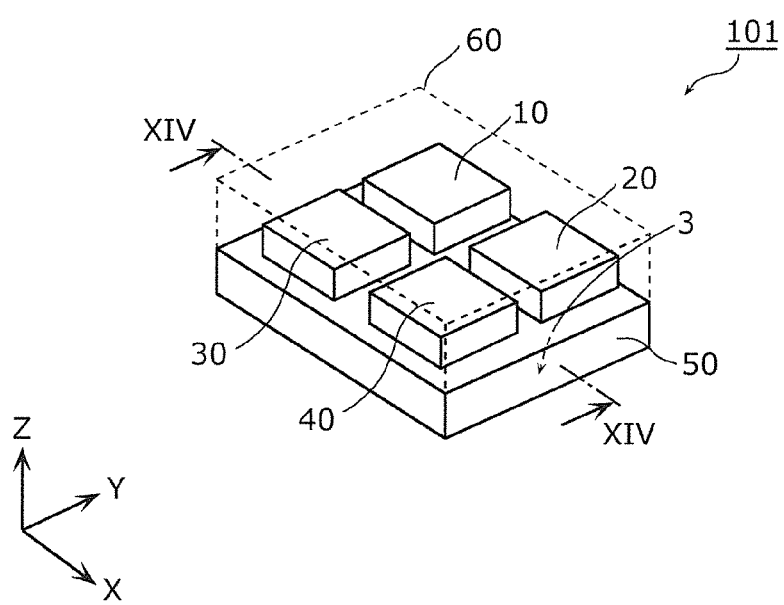
FIG. 13 is a perspective view of an example of an outer appearance of a multiplexer according to a second preferred embodiment of the present invention.
Figure 14:
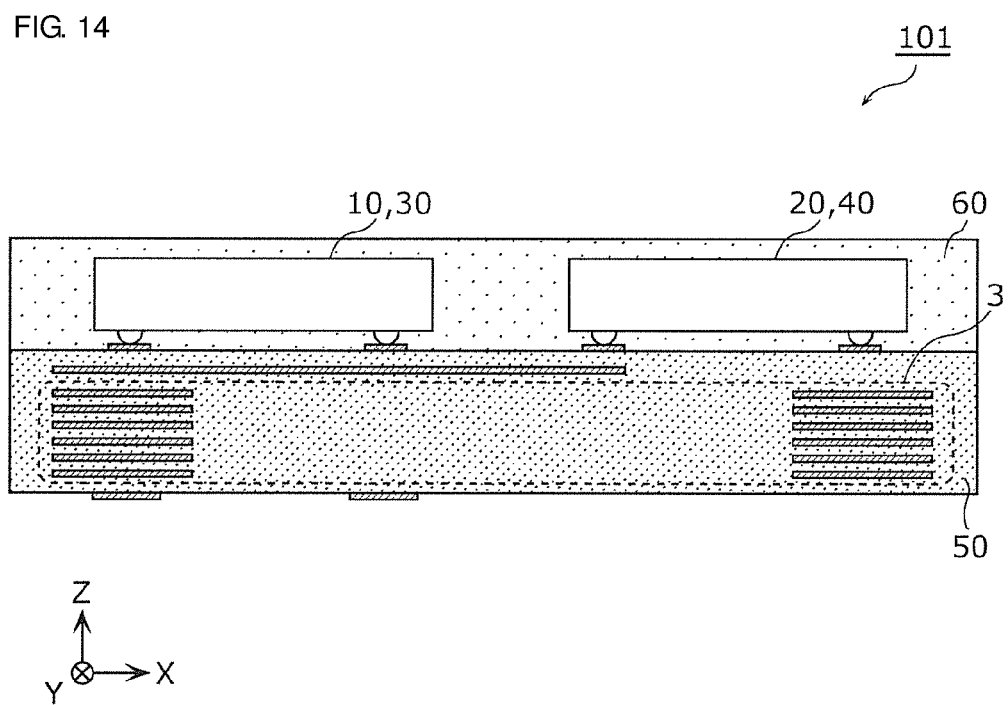
FIG. 14 is an illustration conceptually showing an example of a cross-sectional structure of the multiplexer according to the second preferred embodiment of the present invention.

FIG. 13 is a perspective (oblique) view showing an example of an outer appearance of a multiplexer 101 according to this preferred embodiment. FIG. 14 is an illustration conceptually showing an example of a cross-sectional structure of the multiplexer 101 according to this preferred embodiment. FIG. 13 shows a sealing resin 60 in a perspective (transparent) manner. Also, FIG. 14 is a side view of the band pass filters 10 to 40.

As shown in FIGS. 13 and 14, the multiplexer 101 includes the band pass filters 10 to 40 configured as, for example, piezoelectric chips, and provided on one of principal surfaces of a multilayer substrate 50 having embedded therein the inductor 3. That is, the band pass filters 10 to 40 are mounted on the multilayer substrate 50.

One of an input terminal and an output terminal of each of the band pass filters 10 to 40 is connected to, for example, the common terminal 21 defined by a surface electrode of the multilayer substrate 50 by wiring provided at the multilayer substrate 50. In this preferred embodiment, the band pass filters 10 to 40 are sealed with the sealing resin 60, such as thermosetting resin or photo-curable resin. The material of the sealing resin 60 is not particularly limited as long as the material is an insulating material. Also, the band pass filters 10 to 40 may not be sealed with the sealing resin 60.

The multilayer substrate 50 includes various conductors that define the inductor 3 and the circuit of the multiplexer 101. The conductors include a surface electrode to mount the multiplexer 101 on a mother board such as a printed circuit board, a surface electrode to mount the band pass filters 10 to 40 on the multilayer substrate 50, a substantially loop-shaped in-plane conductor defining the inductor 3, and an inter-layer conductor that penetrates through respective layers in the thickness direction.

With this preferred embodiment, since the multiplexer 101 includes the matching circuit (in this preferred embodiment, the inductor 3), the bandpass loss and return loss are decreased without an externally provided matching circuit.

Also, in this preferred embodiment, since the band pass filters 10 to 40 are mounted on the multilayer substrate 50 having embedded therein the inductor 3, the size is reduced and the bandpass loss and return loss are decreased.

Alternatively, the multiplexer having embedded therein the matching circuit may include a matching circuit mounted on a printed circuit board or the like, and band pass filters 10 to 40 mounted on the printed circuit board.

Other Preferred Embodiments

The multiplexers according to the preferred embodiments and their modifications have been described above; however, the present invention is not limited to the individual preferred embodiments and their modifications. Without departing from the scope of the present invention, configurations obtained by adding various modifications conceivable by those skilled in the art to the preferred embodiments and their modifications, and preferred embodiments constructed by combining the components in the different preferred embodiments and their modifications may be included in one aspect or a plurality of aspects of the present invention.

Also, in the above description, the multiplexer is exemplified; however, the present invention may be applied to a wave separator including an n number (n being a natural number of 3 or larger) of band pass filters having an n number or larger of mutually different pass bands, and the common terminal commonly provided for the n number of band pass filters. That is, all band pass filters may be reception side filters that filter a reception wave input from the common terminal 21 in a predetermined reception pass band, and output the filtered reception wave to a reception output terminal.

Figure 15:
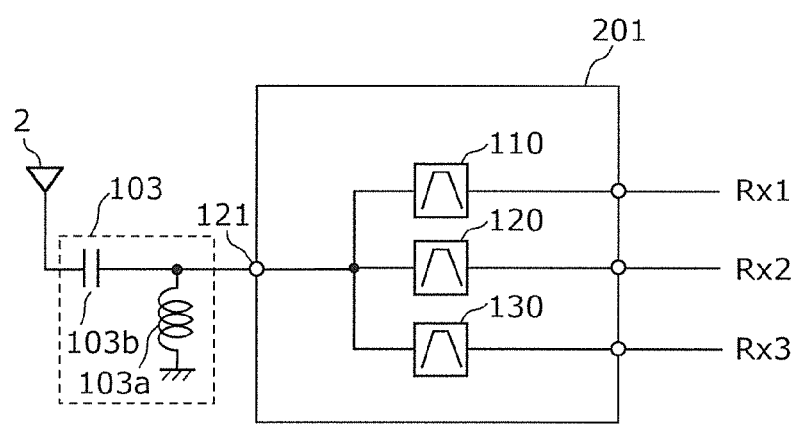
FIG. 15 is a general configuration diagram of a wave separator according to another preferred embodiment of the present invention.

FIG. 15 is a general configuration diagram of a wave separator 201 according to another preferred embodiment of the present invention. The drawing also shows the antenna 2 and a matching circuit 103 connected to a common terminal 121 of the wave separator 201.

The wave separator 201 shown in the drawing includes three band pass filters 110 to 130 having three mutually different pass bands (Rx1 to Rx3). Respective input terminals of the band pass filters 110 to 130 are connected to the common terminal 121.

Also in this wave separator 201, among the three band pass filters 110 to 130, a first band pass filter that is one of a band pass filter having a center frequency of a pass band at a lowest side and a band pass filter having a center frequency of a pass band at a highest side and that has a larger or equal difference in a center frequency of a pass band from an adjacent band pass filter as compared with the other band pass filter satisfies one of the above-described configuration (i) and configuration (ii), and hence an advantageous effect similar to the above-described preferred embodiments is attained. That is, the wave separator 201 is able to decrease the bandpass loss and return loss.

Also, in the above description, the inductor 3 having one end connected to the common terminal 21 and the other end connected to the ground is described as an example of the matching circuit connected to the common terminal 21. However, the matching circuit is not limited to this configuration. For example, as shown in FIG. 15, the matching circuit may include an inductor 103a having one end connected to the common terminal 121 and the other end connected to the ground, and a capacitor 103b provided in series between the antenna 2 and the common terminal 121.

Figure 16:
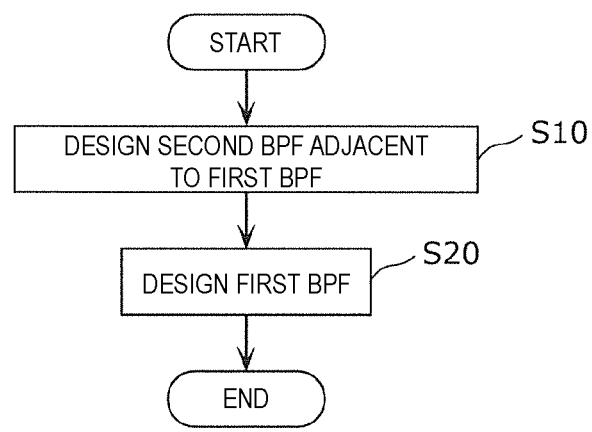
FIG. 16 is a flowchart showing a method of manufacturing a wave separator.

Also, a preferred embodiment of the present invention may be realized as a method of manufacturing the wave separator. FIG. 16 is a flowchart showing a method of manufacturing the wave separator.

That is, the method of manufacturing the wave separator is a method of manufacturing a wave separator including an n number (n being a natural number of 3 or larger) of band pass filters having an n number or larger of mutually different pass bands and a common terminal commonly connected to the n number of band pass filters. Among the n number of band pass filters, for a first band pass filter that is one of a band pass filter having a center frequency of a pass band at a lowest side and a band pass filer having a center frequency of a pass band at a highest side and that has a larger or equal difference in a center frequency of a pass band from an adjacent band pass filter as compared with the other band pass filter, when f(1) is a center frequency of a pass band and B(1) is a susceptance value with the center frequency viewed from the common terminal, and among the n number of band pass filters, for a second band pass filter having a pass band adjacent to the first band pass filter, when f(2) is a center frequency of a pass band and B(2) is a susceptance value with the center frequency viewed from the common terminal, the method includes a step of forming the second band pass filter (S10), and a step of providing the first band pass filter (S20) so that the first band pass filter satisfies one of a configuration (i) and a configuration (ii) for the second band pass filter as follows:

(i) $B(2) \times \{2 \times f(2) - f(1)\}/f(1) < B(1) < B(2)$ if the first band pass filter is the band pass filter at the highest side, and (ii) $B(2) < B(1) < B(2) \times \{2 \times f(2) - f(1)\}/f(1)$ if the first band pass filter is the band pass filter at the lowest side.

To be specific, in the step of forming the second band pass filter (S10), each k-th ($2 \leq k \leq n$) band pass filter among the n number of band pass filters is designed, and for the k-th ($2 \leq k \leq n$) band pass filter, when f(k) is a center frequency of a pass band and B(k) is a susceptance value with the center frequency viewed from the common terminal, in the step of forming the first band pass filter, design is made so that the first band pass filter satisfies one of a configuration (iii) and a configuration (iv) for each of the second to n-th band pass filters as follows:

(iii) $B(k) \times \{2 \times f(k) - f(1)\}/f(1) < B(1) < B(k)$ if the first band pass filter is the band pass filter at the highest side, and (iv) $B(k) < B(1) < B(k) \times \{2 \times f(k) - f(1)\}/f(1)$ if the first band pass filter is the band pass filter at the lowest side.

Also, to be specific, the first band pass filter is an elastic wave filter having a series arm resonator connected to the common terminal. In the step of forming the first band pass filter (S20), design is made to satisfy one of the above-described configuration (i) and configuration (ii) by increasing or decreasing the number of pairs of electrode fingers of the IDT electrodes of the series arm resonator.

Such a method of manufacturing the wave separator is executed by using, for example, a computer such as a computer-aided design (CAD) device. Also, the manufacturing method may be executed by the computer through an interactive operation by a designer with the computer.

The step of forming the second band pass filter (S10) and the step of forming the first band pass filter (S20) may be executed sequentially in that order, may be executed in the inverted order, or may be executed at the same time.

For example, the steps (S10 and S20) may be executed at the same time by using an automatic tool such as electronic design automation (EDA) with regard to the structure, such as the number of pairs of electrode fingers of the IDT electrodes corresponding to the required specifications of the bandpass characteristics in each frequency band (Band).

Preferred embodiments of the present invention can be widely used as a multiplexer having low bandpass loss and low return loss, for a communication device such as a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wave separator comprising:
   an n number of band pass filters including an n number or larger of mutually different pass bands where n is a natural number of 3 or larger; and
   a common terminal commonly provided for the n number of band pass filters; wherein
   among the n number of band pass filters, for a first band pass filter that is one of a band pass filter having a center frequency of a pass band at a lowest side and a band pass filter having a center frequency of a pass band at a highest side and that has a larger or equal difference in a center frequency of a pass band from an adjacent band pass filter as compared with the other of the lowest side and highest side band pass filter and a band pass filter adjacent thereto, when f(1) is a center frequency of a pass band and B(1) is a susceptance value with the center frequency viewed from the common terminal; and
   among the n number of band pass filters, for a second band pass filter having a pass band adjacent to the first band pass filter, when f(2) is a center frequency of a pass band and B(2) is a susceptance value with the center frequency viewed from the common terminal;
   the first band pass filter satisfies one of a configuration (i) and a configuration (ii) for the second band pass filter as follows:
   (i) $B(2) \times \{2 \times f(2) - f(1)\}/f(1) < B(1) < B(2)$ if the first band pass filter is the band pass filter at the highest side; and
   (ii) $B(2) < B(1) < B(2) \times \{2 \times f(2) - f(1)\}/f(1)$ if the first band pass filter is the band pass filter at the lowest side.

2. The wave separator according to claim 1, wherein
   among the n number of band pass filters, for a k-th ($2 \leq k \leq n$) band pass filter, when f(k) is a center frequency of a pass band, and B(k) is a susceptance value with the center frequency viewed from the common terminal;
   the first band pass filter satisfies one of a configuration (iii) and a configuration (iv) for each of the second to n-th band pass filters as follows:
   (iii) $B(k) \times \{2 \times f(k) - f(1)\}/f(1) < B(1) < B(k)$ if the first band pass filter is the band pass filter at the highest side; and
   (iv) $B(k) < B(1) < B(k) \times \{2 \times f(k) - f(1)\}/f(1)$ if the first band pass filter is the band pass filter at the lowest side.

3. The wave separator according to claim 1, wherein the first band pass filter is an elastic wave filter including a series arm resonator connected to the common terminal.

4. The wave separator according to claim 3, wherein the first band pass filter further includes a parallel arm resonator connected between one of nodes of the series arm resonator and a reference terminal.

5. The wave separator according to claim 3, wherein the series arm resonator is directly connected to the common terminal with no elements interposed therebetween.

6. The wave separator according to claim 1, further comprising:
a matching circuit connected to the common terminal; wherein
the first band pass filter satisfies one of the configuration (i) and the configuration (ii) for the second band pass filter without matching by the matching circuit.

7. The wave separator according to claim 6, wherein
the matching circuit includes an inductor including a first end connected to the common terminal and a second end connected to the reference terminal;
the inductor is embedded in a multilayer substrate; and
the n number of band pass filters are mounted on the multilayer substrate.

8. The wave separator according to claim 1, wherein the wave separator is a multiplexer.

9. The wave separator according to claim 1, wherein the wave separator is a quadplexer.

10. The wave separator according to claim 1, further comprising an antenna and an inductor connected to the common terminal.

11. The wave separator according to claim 1, wherein each of the n number of band pass filters includes surface acoustic wave filters or bulk acoustic wave filters.

12. The wave separator according to claim 1, wherein each of the n number of band pass filters includes a chip inductor and a chip capacitor.

13. The wave separator according to claim 1, wherein each of the n number of band pass filters includes series arm resonators, a parallel arm resonator, and a longitudinally coupled filter.

14. The wave separator according to claim 13, wherein the parallel arm resonator is located between one of nodes of one of the series arm resonators and a reference terminal.

15. The wave separator according to claim 1, wherein the wave separator is a multiplexer including a matching circuit.

16. The wave separator according to claim 15, wherein the multiplexer includes a multilayer substrate including therein the matching circuit.

17. The wave separator according to claim 16, wherein the n number of band pass filters are piezoelectric chips mounted on the multilayer substrate.

18. The wave separator according to claim 17, further comprising a sealing resin provided to seal the n number of band pass filters on the multilayer substrate.

19. The wave separator according to claim 1, wherein the n number of band pass filters are reception side filters that filter a reception wave input from the common terminal.

20. The wave separator according to claim 1, further comprising:
a matching circuit connected to the common terminal; wherein
the matching circuit includes an inductor including a first end connected to the common terminal and a second end connected to ground, and a capacitor connected in series between an antenna and the common terminal.

* * * * *